(12) United States Patent
Lee

(10) Patent No.: US 6,211,064 B1
(45) Date of Patent: Apr. 3, 2001

(54) METHOD FOR FABRICATING CMOS DEVICE

(75) Inventor: Jong Wook Lee, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/343,749

(22) Filed: Jun. 30, 1999

(30) Foreign Application Priority Data

Jun. 30, 1998 (KR) .............................. 1998-26035

(51) Int. Cl.[7] .................................. H01L 21/4763
(52) U.S. Cl. ...................... 438/626; 438/162; 438/297
(58) Field of Search .................... 438/626, 297, 438/162, 165, 423, 444, 163, 424, 395, 396, 349; 257/396, 349

(56) References Cited

U.S. PATENT DOCUMENTS

| 5,463,238 | * 10/1995 | Takahashi et al. ............. 257/351 |
| 5,712,173 | * 1/1998 | Lui et al. ........................ 438/297 |
| 5,801,080 | 9/1998 | Inoue et al. .................... 438/405 |
| 5,811,315 | 9/1998 | Yindeepol et al. . |
| 5,949,115 | * 9/1999 | Yamazaki et al. ............ 257/396 |
| 5,973,365 | * 10/1999 | Deleonibus .................... 257/349 |

FOREIGN PATENT DOCUMENTS

| 7-74363 | 3/1995 | (JP) . |
| 7-201773 | 8/1995 | (JP) . |
| 8-293610 | 11/1996 | (JP) . |

* cited by examiner

*Primary Examiner*—David Nelms
*Assistant Examiner*—Dung A Le
(74) *Attorney, Agent, or Firm*—Ladas & Parry

(57) ABSTRACT

A method for fabricating a CMOS device on a SOI, comprising the steps of: providing a SOI wafer having a stack structure of a base substrate, a buried oxide layer and a semiconductor layer; forming a field oxide film in the semiconductor layer to define an active region in which a PMOS device and a NMOS device are to be formed in the semiconductor layer of the SOI wafer, wherein the field oxide film is formed by performing thermal oxidation process so as to apply a compressive stress to the semiconductor layer that the PMOS device is to be formed; and forming the PMOS device and NMOS device in the active region defined by the field oxide film.

5 Claims, 9 Drawing Sheets

Buried oxide = 1000Å

Buried oxide = 2000Å

Buried oxide = 3000Å

Buried oxide = 4000Å

Buried oxide = 1000Å

Buried oxide = 2000Å

Buried oxide = 3000Å

Buried oxide = 4000Å

Buried oxide = 1000Å

Buried oxide = 2000Å

METHOD FOR FABRICATING CMOS DEVICE

BACKGROUND OF THE INVENTION

1. Field of the Invention

The present invention relates to a method for fabricating a semiconductor device using a SOI(silicon on insulator) wafer, and more particularly to a method for fabricating a CMOS device capable of increasing hole mobility in a PMOS device.

2. Description of the Related Art

Due to the fast development in semiconductor device industry, a semiconductor device using the SOI wafer instead of a single crystalline silicon wafer made of bulk silicon, has been proposed. A semiconductor device formed in the SOI wafer (hereinafter, SOI device) compared to that formed in the single crystalline silicon wafer, has advantages that a high speed due to a low junction capacitance, and driving voltage in reduction due to a low threshold voltage and latch-up prevention due to a complete isolation.

The SOI wafer has a stack structure of a base substrate as a means for supporting, a buried oxide layer disposed on the base substrate, and a semiconductor layer in which a device is formed and disposed on the buried oxide layer. Herein, the semiconductor layer should have a uniform thickness and more preferably has a thickness below 100 nm so that the device formed in the SOI wafer has the foregoing advantages.

On the other hand, in the CMOS device that is comprised of a NMOS device and a PMOS device, the hole mobility in the PMOS device is generally lower than the electron mobility in the NMOS device. That means, the CMOS device formed in the SOI wafer may not have good property owing to the PMOS device having relatively poor carrier mobility. Accordingly, it should be required to increase the hole mobility in the PMOS device in order for the CMOS formed in the SOI wafer to have good property.

There is taught in IEEE trans. Electron Device, vol., 39, p. 2665,1992, M. Roser, S. R. Clayton, P. R. de la Houssaye and G. A. Garcia, Hole-mobility in fully depleted thin-layer SOS MOSFETs that the hole mobility is increased when the compressive which is a stress type existing in the semiconductor layer of the CMOS formed on the SOI wafer.

FIG. 1 is a graph showing the hole mobility vs. the gate voltage based on the compressive stress applied to the semiconductor layer in the PMOS transistor formed on the SOI wafer. In the drawing, A signifies the case where the compressive stress within the semiconductor layer is relatively small and B signifies the case where the compressive stress within the semiconductor layer is relatively great.

As shown in the drawing, the maximum hole mobility is obtained at gate voltage of −1.0V when the compressive stress in the semiconductor layer is great, i.e. in case of B. As a result, it is obvious that the hole mobility is increased when the compressive stress in the semiconductor layer is great.

Therefore, it is required to increase the hole mobility in the PMOS device so as to improve the property of CMOS device formed in the SOI wafer, and the semiconductor layer acting as a body in the PMOS device should be affected by the compressive stress so as to increase the hole mobility in the PMOS device.

SUMMARY OF THE INVENTION

It is the object of the present invention to provide a method for fabricating a CMOS device capable of increasing the hole mobility in a PMOS device of the CMOS device.

It is provided to a method to accomplish the foregoing object of the present invention comprising the steps of: providing a SOI wafer having a stack structure of a base substrate, a buried oxide layer and a semiconductor layer; forming a field oxide film in the semiconductor layer to define an active region in which a PMOS device and a NMOS device are to be formed in the semiconductor layer of the SOI wafer, wherein the field oxide film is formed by performing thermal oxidation process so as to apply a compressive stress to the semiconductor layer that the PMOS device is to be formed; and forming the PMOS device and NMOS device in the active region defined by the field oxide film.

In one embodiment of the present invention, the thermal oxidation process is performed at temperature of 1,000 to 1,200° C. for 220 to 240 minutes under dry oxygen atmosphere and the buried oxide layer has a thickness of 2,000~3,000 Å.

In another embodiment of the present invention, the thermal oxidation process is performed at temperature of 1,000 to 1,200° C. for 190 to 210 minutes under dry oxygen atmosphere and the buried oxide layer has a thickness of 800~1,200 Å.

Those conditions of thermal oxidation process and thickness of the buried oxide can be controlled so as to increase the compressive stress within a semiconductor layer which a PMOS device is formed therein.

BRIEF DESCRIPTION OF THE DRAWINGS

The object, spirit and advantages of the present invention will be readily understood by the accompanying drawings and detailed descriptions.

DETAILED DESCRIPTION OF THE INVENTION

Figure 1:
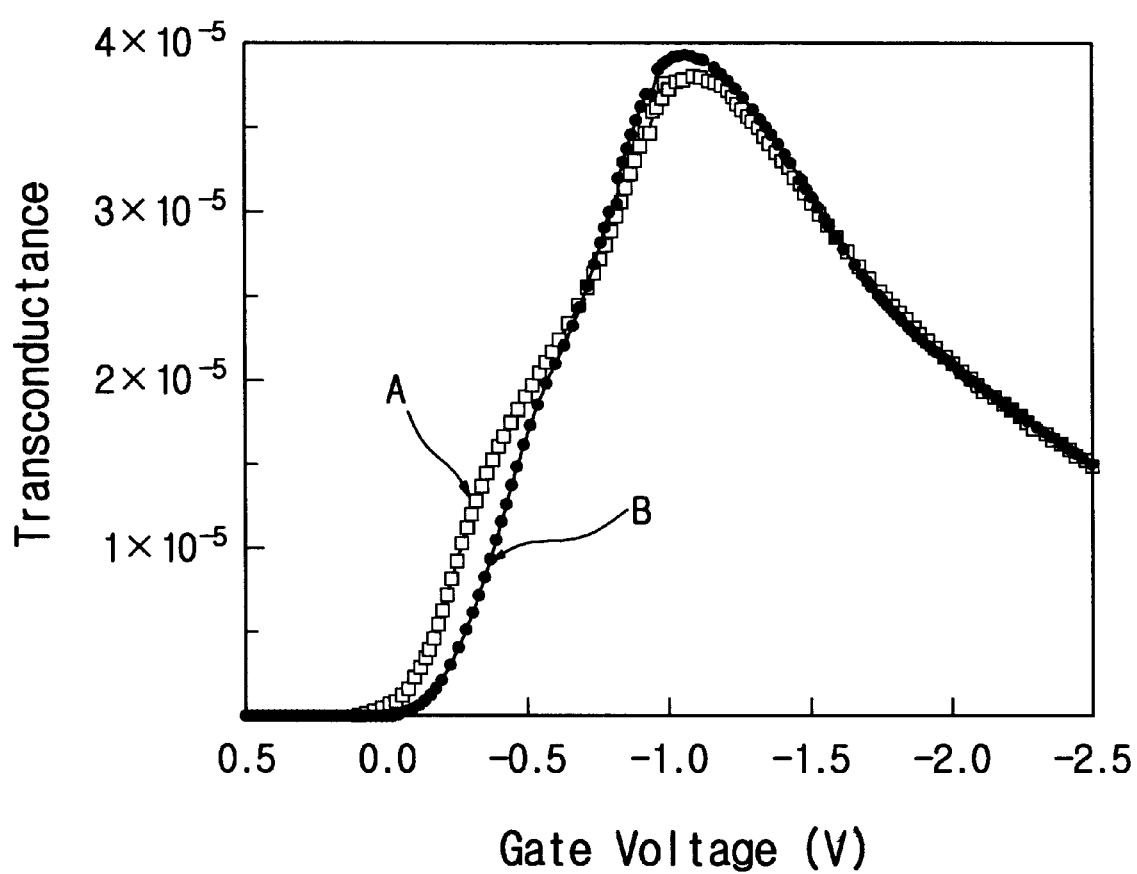
FIG. 1 is a graph showing the hole mobility vs. the gate voltage based on the compressive stress applied to a semiconductor layer of the PMOS device formed on the SOI wafer.
Figure 2:
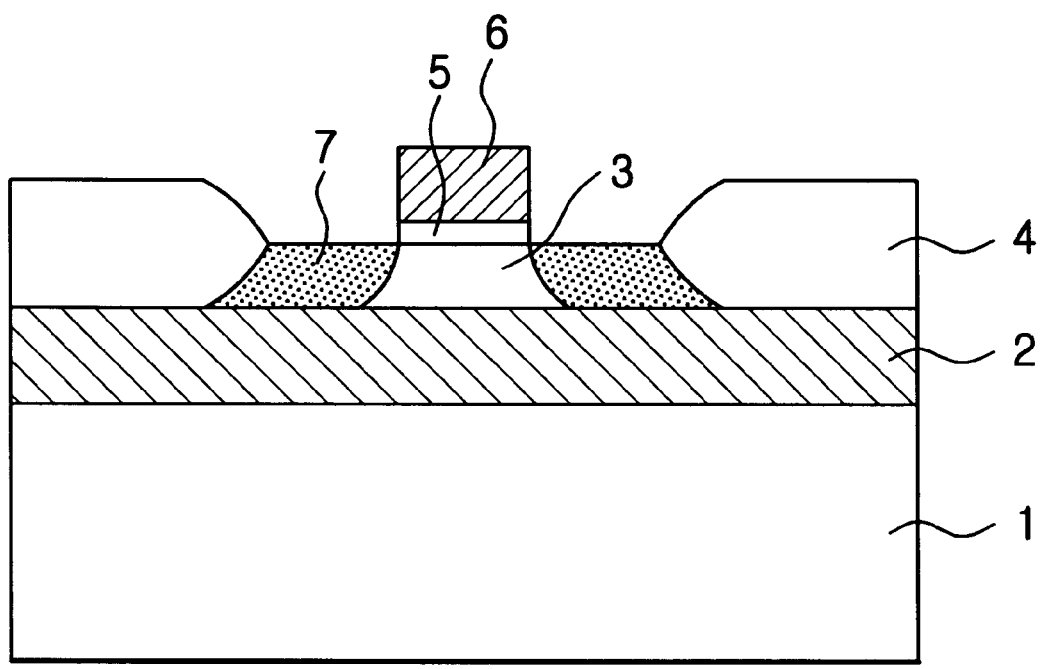
FIG. 2 is a cross-sectional view showing a PMOS device formed on an SOI wafer according to an embodiment of the present invention.

FIG. 2 is a cross-sectional view showing a PMOS device formed on an SOI wafer according to an embodiment of the present invention. Reference numeral 1 designates a base substrate, 2 a buried oxide layer, 3 a semiconductor layer doped with a n-type impurity, 4 a field oxide film, 5 a gate oxide layer, 6 a gate electrode, and 7 a p+ type source/drain electrode region, respectively.

This invention forms the field oxide film 4 by a conventional local oxidation of silicon(LOCOS) process, since degree of the compressive stress applied to in the semiconductor layer 3 varies depending on the thermal oxidation conditions such as the temperature and time. Furthermore, it is because the compressive stress applied to the semiconductor layer 3 during the thermal oxidation process is increased as the thickness of the buried oxide film 2 is thin.

Accordingly, in the embodiment of the present invention, the compressive stress can be controlled by controlling conditions of the thermal oxidation process and the thickness of buried oxide layer. The thermal oxidation process in the present embodiment is carried out under oxygen atmosphere at temperature of 1,000~1,200° C. for 220~240 minutes and at this time, the buried oxide layer is formed at a thickness of 2,000~3,000 Å. On the other hand, in another embodiment of the present invention, the thermal oxidation process is carried out under oxygen atmosphere at temperature of 1,000~1,200° C. for 190~210 minutes and at this time, the buried oxide layer is formed at a thickness of 800~1,200 Å.

Furthermore, in the LOCOS process, a stress existing at an interface of the buried oxide layer 2 and the semiconductor layer 3 varies depending on thicknesses of a pad oxide layer and a silicon nitride layer (not shown in drawing) being used as an isolation oxide mask in the LOCOS process. The thicknesses of the pad oxide layer and the silicon nitride layer in the LOCOS process of the present invention are in the ranges of 50~150 Å and 2,000~3,000 Å, respectively.

More detailed descriptions on the compressive stress applied to the semiconductor layer depending on the variation of process variables will be discussed hereinafter.

FIGS. 3A to 3D shows the data that the compressive stress applied to the semiconductor layer varies depending on the thickness of buried oxide layer at 1,000 Å, 2,000 Å, 3,000 Å and 4,000 Å in case where the field oxide film 4 is formed in semiconductor layer at a thickness of 2,900 to 3,100 Å by thermal oxidation process performing at the temperature of 1,000 to 1,200° C. for 220 to 240 minutes under dry oxygen atmosphere. Dots in the drawing stand for the degree of compressive stress applied to the semiconductor layer and accordingly it is regarded as the more dots are shown in the drawing, the more compressive stress lies on the semiconductor layer.

Figure 3A:
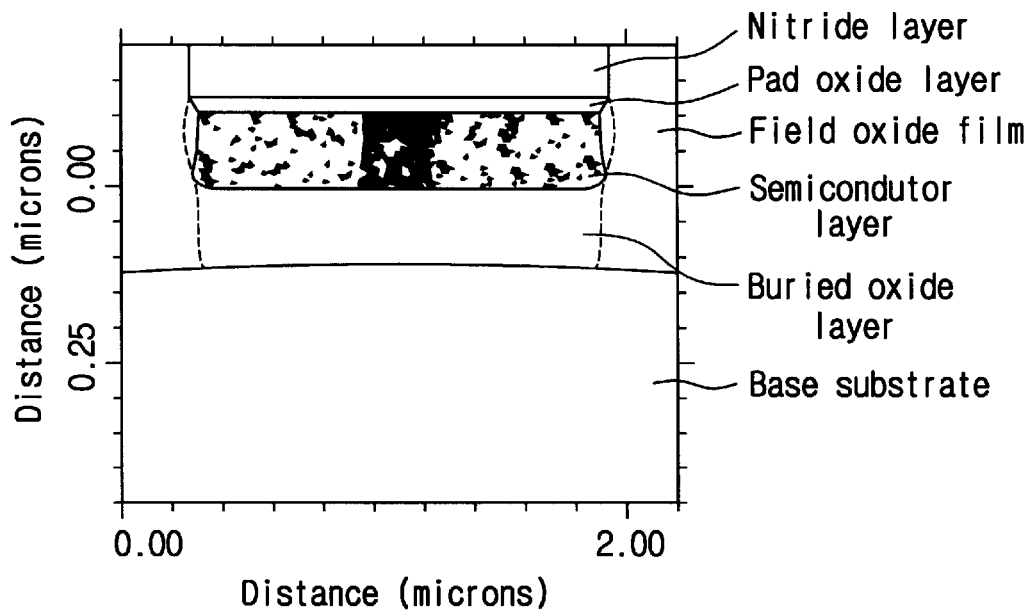
FIGS. 3A to 3D are the data showing a compressive stress applied to a semiconductor layer according to the thickness of a buried oxide layer when a field oxide film is formed in a semiconductor layer with the thickness of 2,900 to 3,100 Å by thermal oxidation process performing at the temperature of 1,000 to 1,200° C. for 220 to 240 minutes under dry oxygen atmosphere.
Figure 3B:
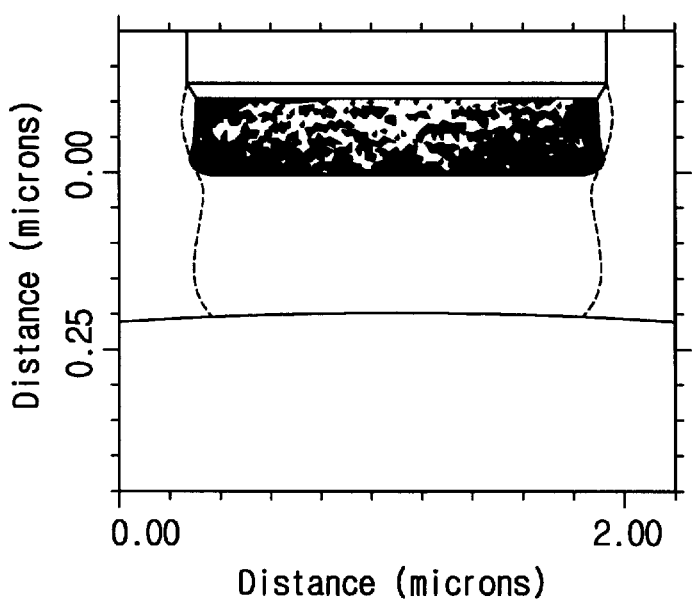
Figure 3C:
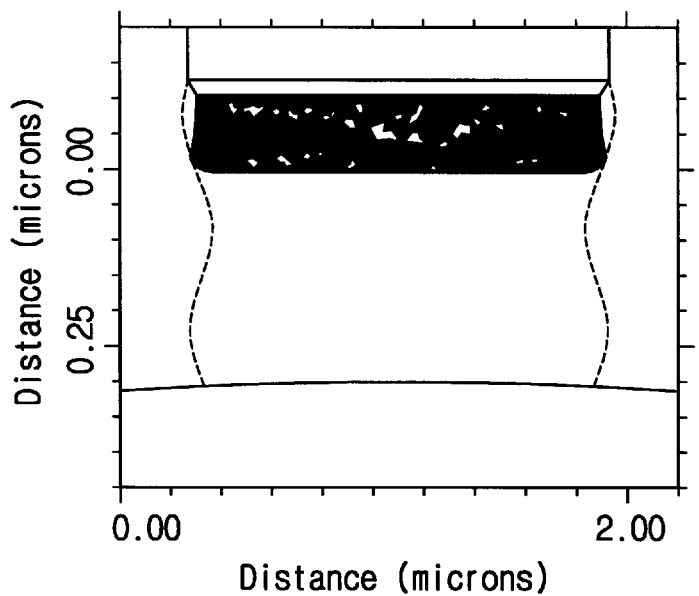
Figure 3D:
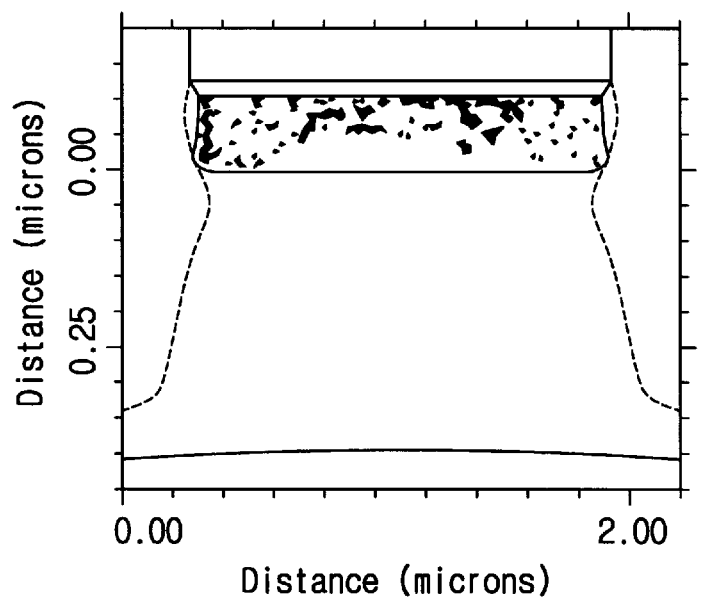

It is obvious that the compressive stress in the semiconductor layer having the buried oxide layer at a thickness of 2,000 Å or 3,000 Å as shown in FIGS. 3B and 3C, is relatively greater than that at a thickness of 1,000 Å or 4,000 Å as shown in FIGS. 3A and 3D. Accordingly, by carrying out thermal oxidation process with above conditions, the thickness of the buried oxide layer is selected in the range of 2,000~3,000 Å preferably. In the meantime, the compressive stress in the semiconductor layer is approximately in the range of $1 \times 10^{10} \sim 1 \times 10^{12}$ dyne/cm² after the thermal oxidation process with such conditions as described above.

FIGS. 4A to 4D show the data that the compressive stress applied to a semiconductor layer varies depending on the thickness of buried oxide layer at 1,000 Å, 2,000 Å, 3,000 Å and 4,000 Å in case where the field oxide film 4 is formed in semiconductor layer at a thickness of 2,700 to 2,800 Å by thermal oxidation process performing at the temperature of 1,000 to 1,200° C. for 190 to 210 minutes under dry oxygen atmosphere.

Figure 4A:
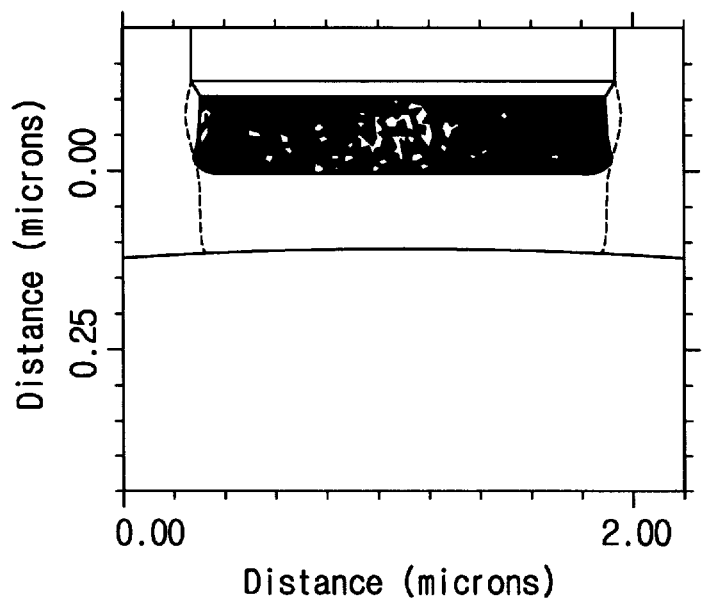
FIGS. 4A to 4D are the data showing a compressive stress applied to a semiconductor layer according to the thickness of a buried oxide layer when a field oxide film is formed in a semiconductor layer with the thickness of 2,700 to 2,800 Å by thermal oxidation process performing at the temperature of 1,000 to 1,200° C. for 190 to 210 minutes under dry oxygen atmosphere.
Figure 4B:
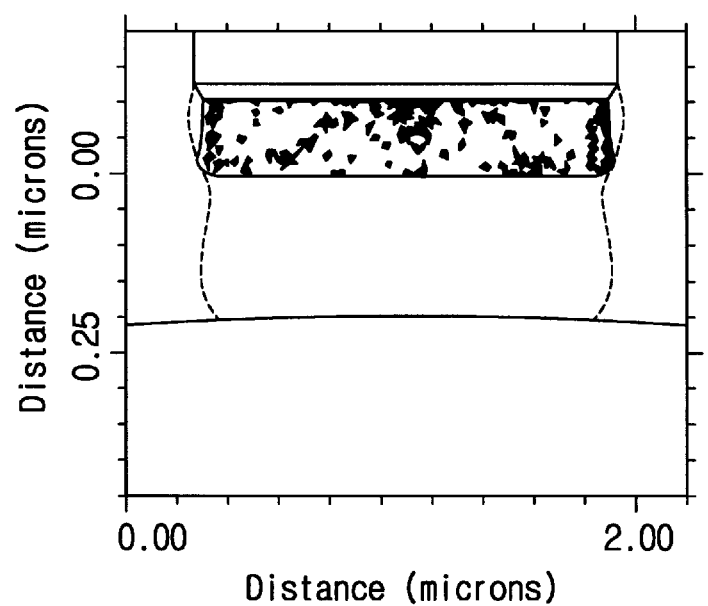
Figure 4C:
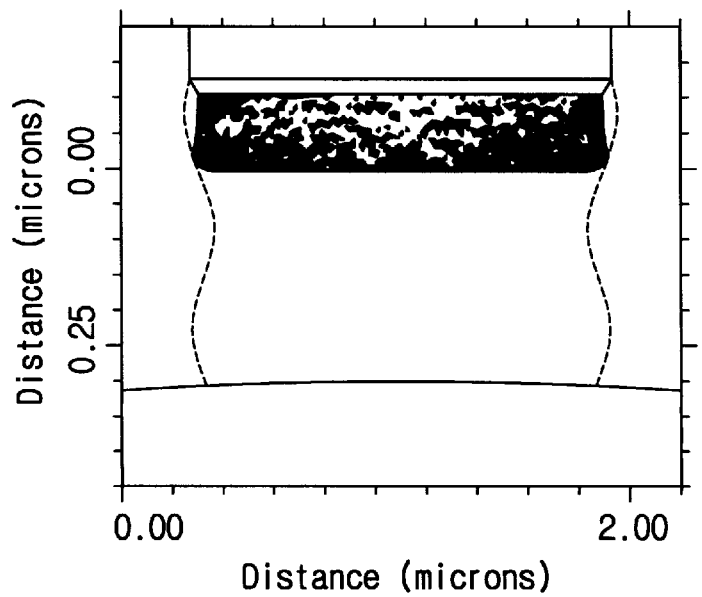
Figure 4D:
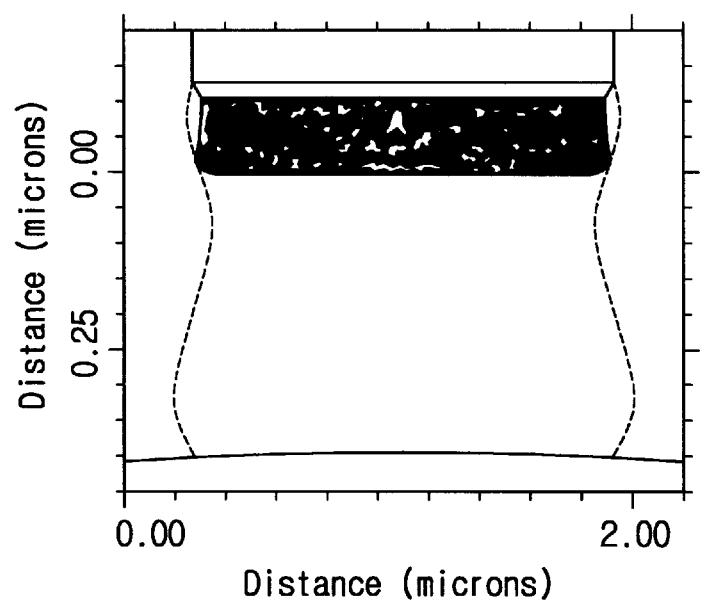
Figure 5A:
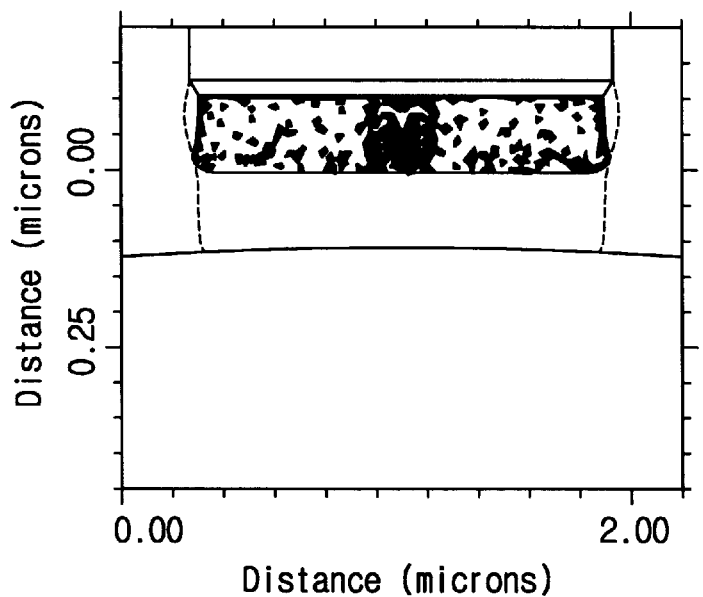
FIGS. 5A to 5D are the data showing a compressive stress applied to a semiconductor layer according to the thickness of a buried oxide layer when a field oxide film is formed in a semiconductor layer with the thickness of 2,400 to 2,600 Å by thermal oxidation process performing at the temperature of 1,000 to 1,200° C. for 160 to 180 minutes under dry oxygen atmosphere.
Figure 5B:
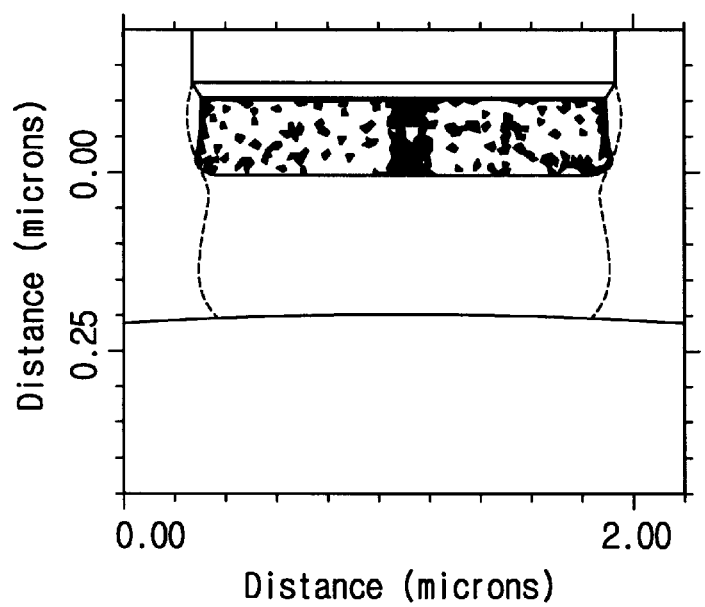
Figure 5C:
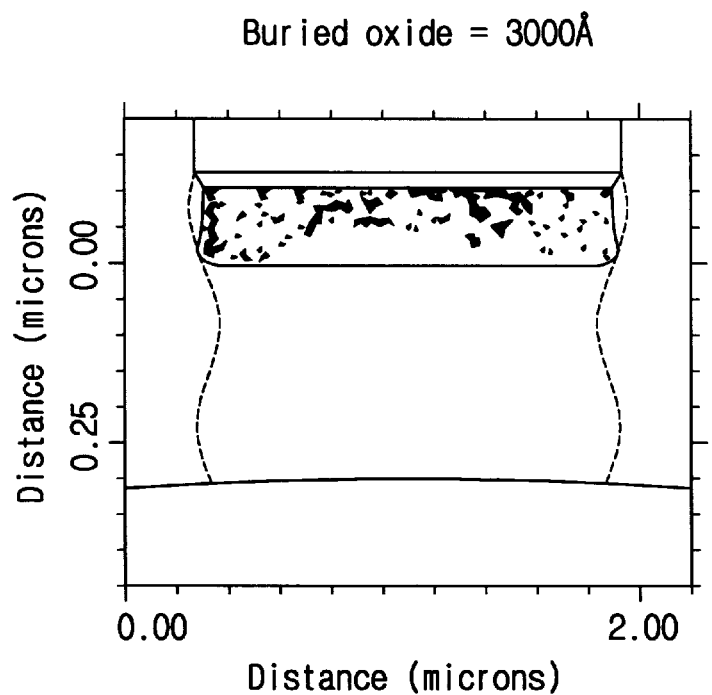
Figure 5D:
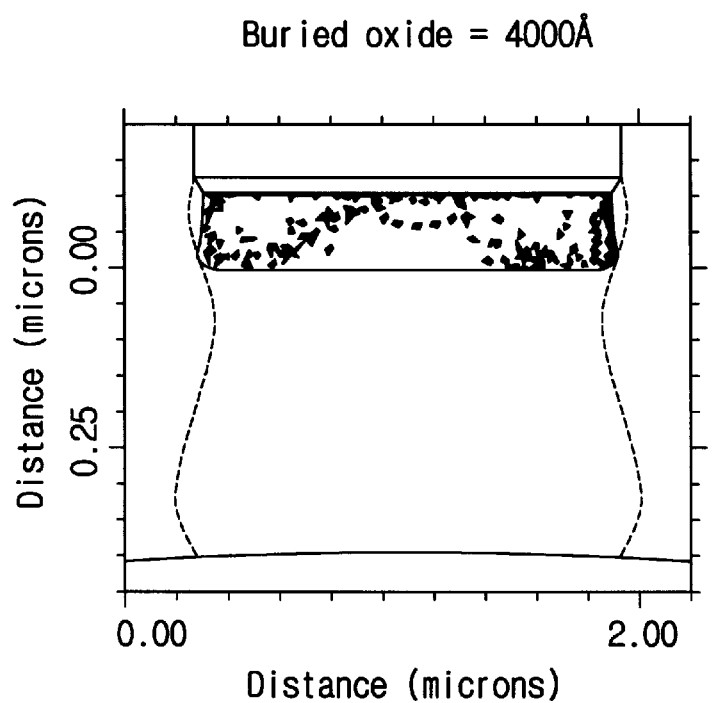

It is obvious that the compressive stress in the semiconductor layer having the buried oxide layer at a thickness of 1,000 Å, 2,000 Å or 3,000 Å, as shown in FIGS. 4A, 4C and 4D, is relatively greater than that at a thickness of 2,000 Å as shown in FIG. 4B. Especially, it is obvious that the compressive stress is the largest in case of the buried oxide layer at a thickness of 1,000 Å. Accordingly, by carrying out thermal oxidation process with above conditions, the thickness of the buried oxide layer is preferably selected in the range of 8,00 Å~1,200 Å, preferably 1,000 Å. Herein, the compressive stress in the semiconductor layer is approximately in the range of $1 \times 10^{10} \sim 1 \times 10^{12}$ dyne/cm².

FIGS. 5A to 5D show the data that a compressive stress applied to a semiconductor layer varies depending on the thickness of buried oxide layer at 1,000 Å, 2,000 Å, 3,000 Å and 4,000 Å in case where the field oxide film 4 is formed in semiconductor layer at a thickness of 2,400 to 2,600 Å by thermal oxidation process performing at the temperature of 1,000 to 1,200° C. for 160 to 180 minutes under dry oxygen atmosphere.

Under the conditions as described above, the compressive stress in the semiconductor layer is not excellent in all cases of the thicknesses of the buried oxide layer as in the previous data. Therefore, the thermal oxidation process is not performed under that circumstance as described above.

Figure 6:
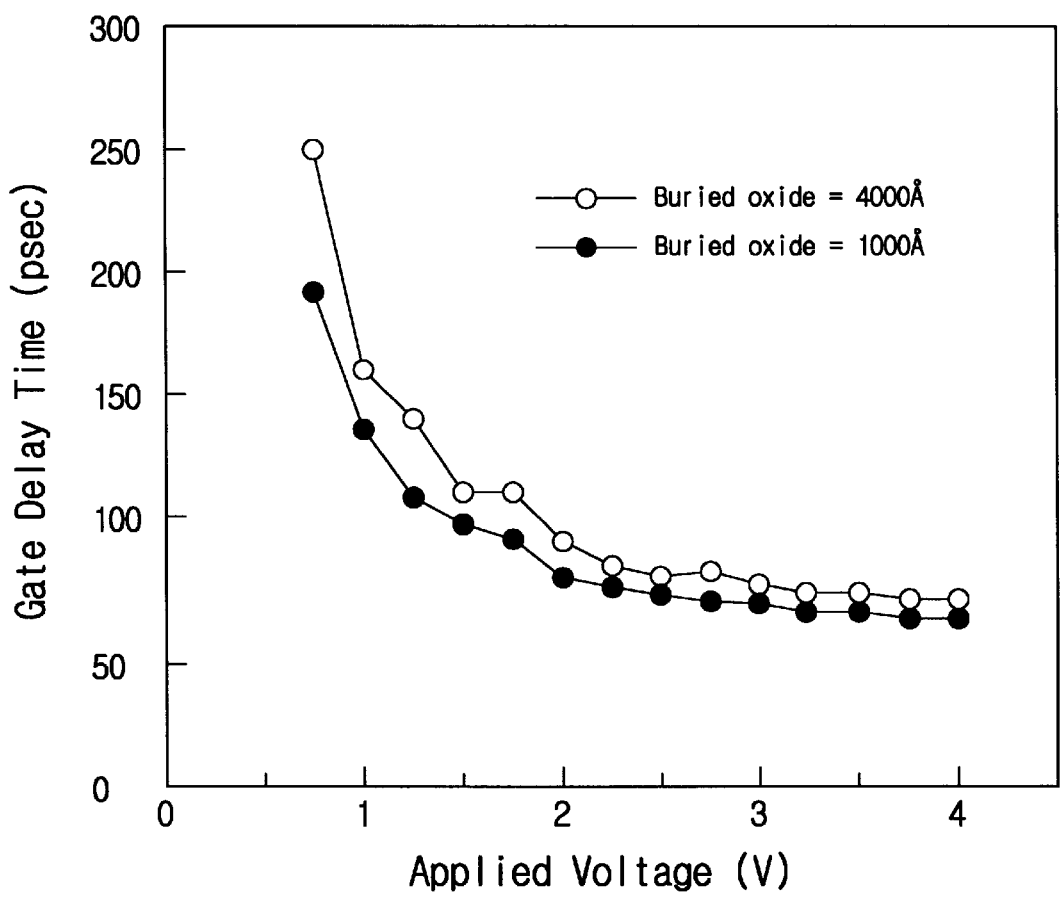
FIG. 6 is a graph showing an applied voltage vs. a gate delay time in case of buried oxide layers having the thicknesses of 1,000 Å and 4,000 Å respectively, When a field oxide film is formed in a semiconductor layer of a SOI wafer with the thickness of 3,000 Å by thermal oxidation process performing at the temperature of 1,100° C. for 230 minute under dry oxygen atmosphere.

FIG. 6 is a graph showing an applied voltage vs. a gate delay time in case of the buried oxide layer having 1,000 Å and 4,000 Å when the thermal oxidation process is carried out under dry oxygen atmosphere at temperature of 1,100° C. for 230 minutes to the field oxide layer on the semiconductor layer of SOI substrate at a thickness of 3,000 Å.

As illustrated, it is noted that the gate delay time in the buried oxide layer of 1,000 Å is smaller than that in the buried oxide layer of 4,000 Å. Therefore, it is noted that excellent carrier mobility can be obtained when the buried oxide layer is 1,000 Å under the process conditions.

As described in the above specification, the hole mobility in the PMOS device depends on the degree of compressive stress existing in the semiconductor layer and the compressive stress in the semiconductor layer varies with the thermal oxidation process and thickness of the buried oxide layer. Therefore, by controlling the thermal oxidation process conditions and the thickness of the buried oxide layer, it can increase the mobility of the hole in the PMOS device by the desired value.

Accordingly, the most suitable process conditions can be chosen according to the required device specification.

Various other modifications will be apparent to and can be readily made by those skilled in the art without departing from the scope and spirit of the present invention.

What is claimed is:

1. A method for fabricating a complementary metal oxide semiconductor (CMOS) device comprising the steps of:

providing a silicon on insulation (SOI) wafer having a stack structure of a base substrate, a buried oxide layer and a semiconductor layer;

forming a field oxide film in the semiconductor layer to define an active region in which a p type metal oxide semiconductor (PMOS) device and an type metal oxide semiconductor (NMOS) device are to be formed in the semiconductor layer of the SOI wafer, wherein the field oxide film is formed by performing thermal oxidation process at the temperature of 1,000 to 1,200° C. under dry oxygen atmosphere so as to apply a compressive stress to the semiconductor layer that the PMOS device is to be formed; and forming the PMOS device and NMOS device in the active region defined by the field oxide film.

2. The method as claimed in claim 1, wherein the thermal oxidation process is performed for 220 to 240 minutes.

3. The method as claimed in claim 2, wherein the buried oxide layer has a thickness of 2,000~3,000 Å.

4. The method as claimed in claim 1, wherein the thermal oxidation process is performed for 190 to 210 minutes.

5. The method as claimed in claim 4, wherein the buried oxide layer has a thickness of 800~1,200 Å.

* * * * *